(12) United States Patent
Peterson et al.

(10) Patent No.: US 7,086,562 B2
(45) Date of Patent: Aug. 8, 2006

(54) METHODS AND APPARATUS FOR RETAINING A TRAY STACK HAVING A PLURALITY OF TRAYS FOR CARRYING MICROELECTRONIC DEVICES

(75) Inventors: Darin L. Peterson, Boise, ID (US); Michael R. Slaughter, Boise, ID (US); Keith P. McCall, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 507 days.

(21) Appl. No.: 09/999,032

(22) Filed: Nov. 1, 2001

(65) Prior Publication Data

US 2002/0159878 A1 Oct. 31, 2002

Related U.S. Application Data

(62) Division of application No. 09/420,659, filed on Oct. 19, 1999.

(51) Int. Cl.
*B65G 59/00* (2006.01)

(52) U.S. Cl. .................. 221/297; 221/222; 221/237

(58) Field of Classification Search ......... 221/221–223, 221/236–238, 297

See application file for complete search history.

(56) References Cited

U.S. PATENT DOCUMENTS

| | | | |
|---|---|---|---|
| 4,324,502 A | 4/1982 | Pickles | |
| 4,372,624 A | 2/1983 | Neilson | |
| 4,842,439 A | 6/1989 | Caldwell et al. | |

(Continued)

FOREIGN PATENT DOCUMENTS

JP 04206700 7/1992

OTHER PUBLICATIONS

Mühlbauer High Tech International, "Integrated Packing Line IPL 6800," 2 pages.

*Primary Examiner*—Janice L. Krizek
(74) *Attorney, Agent, or Firm*—Perkins Coie LLP

(57) ABSTRACT

Devices and methods for holding a tray stack having a plurality of trays configured to carry and store microelectronic devices. Several devices in accordance with the present invention are particularly applicable to carrying a stack of JEDEC trays that have been loaded with a plurality of microelectronic devices. In one embodiment, the device is a tray retainer including a guide structure configured to allow the tray stack to move in a direction of a load/unload path, and to restrict lateral movement of the tray stack with respect to the load/unload path. The guide structure can have a first end, a second end, and an opening at least proximate to the second end. The guide structure, for example, can have first and second channel sections extending in the direction of the load/unload path. The second channel section can also face the first channel section. The tray retainer can also include a cross-member and a moveable retaining element. The cross-member can extend transverse to the load/unload path at least partially across a first region of the guide structure between the first and second channel sections. The cross-member can be spaced apart from the opening toward the first end of the guide structure. The moveable retaining element is positioned at a second region of the guide structure spaced apart from the cross-member. The retaining element can move between a storage position in which it obstructs the load/unload path and a load/unload position in which it does not obstruct the load/unload path.

24 Claims, 10 Drawing Sheets

U.S. PATENT DOCUMENTS

| | | |
|---|---|---|
| 5,366,283 A | 11/1994 | Crose |
| 5,510,723 A | 4/1996 | Canella |
| 5,528,603 A | 6/1996 | Canella et al. |
| 5,648,728 A | 7/1997 | Canella |
| 5,739,050 A | 4/1998 | Farnworth |
| 5,815,000 A | 9/1998 | Farnworth et al. |
| 5,894,218 A | 4/1999 | Farnworth et al. |
| 5,906,472 A | 5/1999 | Nakamura |
| 5,937,270 A | 8/1999 | Canella |
| 5,938,508 A | 8/1999 | Canella |
| 5,986,235 A | 11/1999 | Canella |
| 5,997,388 A | 12/1999 | Canella et al. |
| 6,018,249 A | 1/2000 | Akram et al. |
| 6,025,728 A | 2/2000 | Hembree et al. |
| 6,048,744 A | 4/2000 | Corisis et al. |
| 6,072,323 A | 6/2000 | Hembree et al. |
| 6,081,429 A | 6/2000 | Barrett |
| 6,089,107 A | 7/2000 | Canella et al. |
| 6,094,058 A | 7/2000 | Hembree et al. |
| 6,107,122 A | 8/2000 | Wood et al. |
| 6,112,940 A | 9/2000 | Canella |
| 6,121,067 A | 9/2000 | Canella |
| 6,135,291 A | 10/2000 | Canella |
| 6,150,717 A | 11/2000 | Wood et al. |
| 6,163,956 A | 12/2000 | Corisis |
| 6,188,232 B1 | 2/2001 | Akram et al. |
| 6,198,172 B1 | 3/2001 | King et al. |
| 6,200,386 B1 | 3/2001 | Canella |
| 6,208,156 B1 | 3/2001 | Hembree |
| 6,241,459 B1 | 6/2001 | Canella et al. |
| 6,244,569 B1 | 6/2001 | Canella et al. |
| 6,247,629 B1 | 6/2001 | Jacobson et al. |
| 6,255,833 B1 | 7/2001 | Akram et al. |
| 6,262,388 B1 | 7/2001 | Canella et al. |
| 6,276,464 B1 | 8/2001 | Draney et al. |
| 6,283,703 B1 | 9/2001 | Dowling et al. |
| 6,285,204 B1 | 9/2001 | Farnworth |
| 6,287,068 B1 | 9/2001 | Canella et al. |
| 6,294,839 B1 | 9/2001 | Mess et al. |
| 6,417,484 B1 | 7/2002 | Canella et al. |
| 6,528,760 B1 | 3/2003 | Canella et al. |
| 6,580,957 B1 | 6/2003 | Canella |
| 6,695,571 B1 | 2/2004 | Canella |
| 2002/0034436 A1 | 3/2002 | Peterson et al. |
| 2002/0057963 A1 | 5/2002 | Peterson et al. |

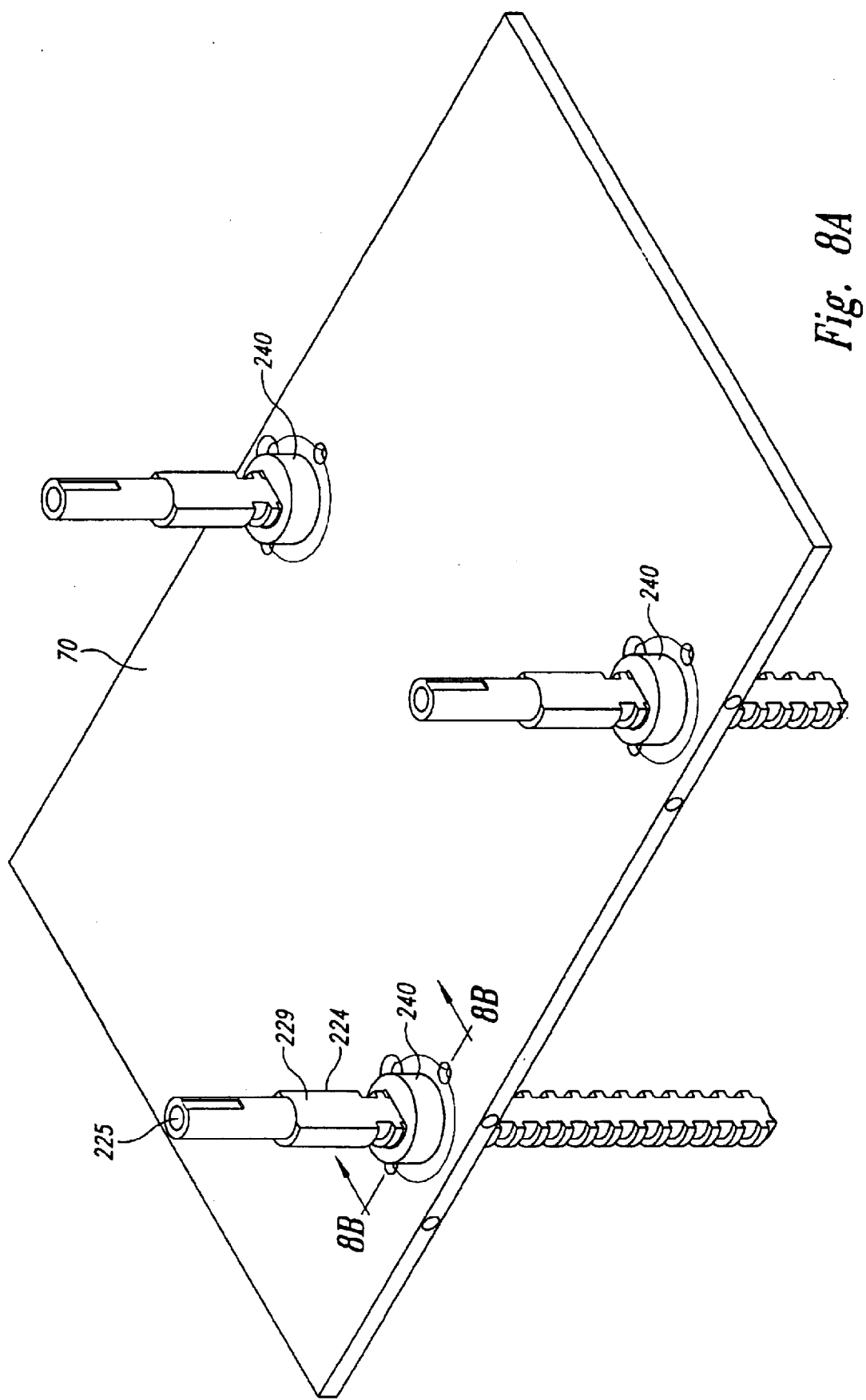

METHODS AND APPARATUS FOR RETAINING A TRAY STACK HAVING A PLURALITY OF TRAYS FOR CARRYING MICROELECTRONIC DEVICES

CROSS REFERENCE TO RELATED APPLICATION

This application is a divisional of pending U.S. patent application Ser. No. 09/420,659, filed on Oct. 19, 1999.

TECHNICAL FIELD

The present invention relates to manufacturing microelectronic devices. More particularly, the present invention relates to handling packaged microelectronic devices that have been loaded onto JEDEC trays or other types of containers.

BACKGROUND

Microelectronic devices can be shipped in a packaged format or an unpackaged format. Packaged microelectronic devices typically include a semiconductor chip, a lead frame, and a protective plastic shell. In one application, the chip has a plurality of bond pads that are electrically coupled to pins of the lead frame. The chip and the lead frame are then encapsulated in the plastic shell, and the pins are generally bent into a desired configuration. Another type of packaged device is a ball grid array. Unpackaged devices can include CSP (Chip Scale Processing) and KGD (Known Good Die) products in which the chip is not encapsulated in a plastic shell. The packaged and unpackaged devices are typically called "IC devices" or "microelectronic devices."

During processing of IC devices, a large number of devices are generally placed in a tray or other container for protection. JEDEC trays, for example, are used in the microelectronic device manufacturing industry to hold memory devices and other types of IC devices. JEDEC trays have a plurality of parallel slots to hold several rows of individual IC devices. The IC devices are often transported between processing machines or stored in the JEDEC trays. For example, IC devices are transported between burn-in ovens, electrical testing machines, marking machines, scanning machines, and the final packaging machines that load the IC devices onto shipping trays, continuous tapes or into tubes.

Several JEDEC trays with a large number of IC devices are generally stacked on each other so that a large batch of IC devices can be stored, transported and processed. In one conventional application for handling JEDEC trays, a disposable band or strap is used to bind several loaded JEDEC trays together and form a tray stack. An empty JEDEC tray is often placed on top of the tray stack to retain the IC devices on the next lower JEDEC tray. To separate the JEDEC trays for processing or testing the particular IC devices, the band is cut or otherwise removed from the tray stack. The individual IC devices are then processed. After the individual IC devices have been processed, they are reloaded onto a JEDEC tray (if they were unloaded), and then the trays are restacked and rebanded into a secure tray stack.

The procedure of banding together a stack of JEDEC trays suffers from several drawbacks. One drawback is that the tray stack can be dropped or jostled before it has been banded. Another drawback is that the banding machine may bend or break the trays. Both of these drawbacks typically result in damaging all, or at least some, of the IC devices in the tray stack. Still another drawback of banding JEDEC trays together is that the banding procedure is time consuming, and it is also cumbersome to stack the banded tray stacks upon each other. A further disadvantage of banding JEDEC trays together is that problems arise in tracking the tray stacks because identification labels attached to the tray stacks can fall off or be placed on the incorrect tray stacks. Therefore, banding JEDEC trays together is not a desirable procedure for handling IC devices.

Another device for handling a stack of JEDEC trays is the Mühlbaur integrated packaging sleeve or stacker. This device has a base plate and an L-shaped leg projecting from each corner of the base plate. It is expected that the Mühlbaur sleeve is operated by placing the sleeve over a stack of JEDEC trays such that the base plate contacts the IC devices in the top JEDEC tray, and then inverting the tray stack and the sleeve so that the JEDEC trays are carried upside down. To load the trays onto a processing machine, it is thus expected the sleeve is reinverted to right the tray stack, and then the sleeve is removed from the tray stack.

Although the Mühlbaur handling sleeve is an improvement over banding JEDEC trays together, it also suffers from several drawbacks. One expected drawback is that the JEDEC trays can fall out of the sleeve if it is dropped or tipped over. Another expected drawback of the Mühlbaur sleeve is that a JEDEC tray can be removed and lost because the trays are not secured to the sleeve. Therefore, even though the Mühlbaur sleeve is an improvement over banding JEDEC trays together, it is also expected to have several drawbacks.

SUMMARY OF THE INVENTION

The present invention relates to devices and methods for holding a tray stack having a plurality of trays configured to carry and store packaged microelectronic devices. Several devices in accordance with the present invention are particularly applicable to carrying a stack of JEDEC trays that have been loaded with a plurality of packaged microelectronic devices. In one embodiment, the device is a tray retainer including a guide structure configured to allow the tray stack to move in a direction of a load/unload path, and to restrict lateral movement of the tray stack with respect to the load/unload path. The guide structure can have a first end, a second end, and an opening at least proximate to the second end. The guide structure, for example, can have first and second channel sections extending in the direction of the load/unload path. The second channel section can also face the first channel section.

The tray retainer can also include a cross-member and a moveable retaining element. The cross-member can extend transverse to the load/unload path and at least partially across a first region of the guide structure between the first and second channel sections. The term "transverse" in the present disclosure means any non-parallel arrangement and is not limited to only a perpendicular arrangement. The cross-member can be spaced apart from the opening toward the first end of the guide structure. The moveable retaining element is positioned at a second region of the guide structure spaced apart from the cross-member. The retaining element, for example, can be attached to the guide structure or a long through-pin within the guide structure.

The retaining element can move between a storage position and a load/unload position. In the storage position, the retaining element projects transverse to the load/unload path and into the guide structure. The retaining element obstructs the opening so that loaded trays cannot be removed from the tray retainer when the retaining element is in the storage position. In the load/unload position, the retaining element either does not project into the guide structure or it does not project as far into the guide structure as it does in the storage position. When the retaining element is in the load/unload position, it does not obstruct the opening so that trays can be loaded or unloaded from the tray retainer.

The tray retainer operates by moving the retaining element between the storage and the load/unload positions to store, transport or process a plurality of packaged microelectronic devices on a tray stack of JEDEC trays or other types of containers. One embodiment of operating the tray retainer includes moving the retaining element to the load/unload position so that the retaining element does not obstruct the load/unload path of the guide structure. A plurality of trays in a tray stack are then inserted into the guide structure by moving the tray stack and/or the tray retainer along the load/unload path. As the trays are loaded into the guide structure, the cross-member engages a first end tray at one end of the tray stack. The retaining element is then moved into the storage position in which it obstructs the load/unload path and contacts a second end tray at an opposite end of the tray stack. In the storage position, the retaining element and the cross-member restrict the tray stack from moving along the load/unload path, and the first and second channel sections of the guide structure restrict the tray stack from moving laterally with respect to the load/unload path. To remove the tray stack from the tray retainer, the retaining element is moved to the load/unload position, and the tray stack and/or the tray retainer is moved in the opposite direction along the load/unload path.

BRIEF DESCRIPTION OF THE DRAWINGS

FIG. 8A is a partial isometric view of another lock-release mechanism in accordance with an embodiment of the invention.

DETAILED DESCRIPTION OF THE INVENTION

The present invention is generally directed toward tray retainers and methods for retaining trays that carry and store a plurality of packaged microelectronic devices. Many specific details of particular embodiments of the invention are described below to provide a thorough understanding of such embodiments. The present invention, however, may have additional embodiments that can be practiced without several of the details described in the following description.

Figure 1:
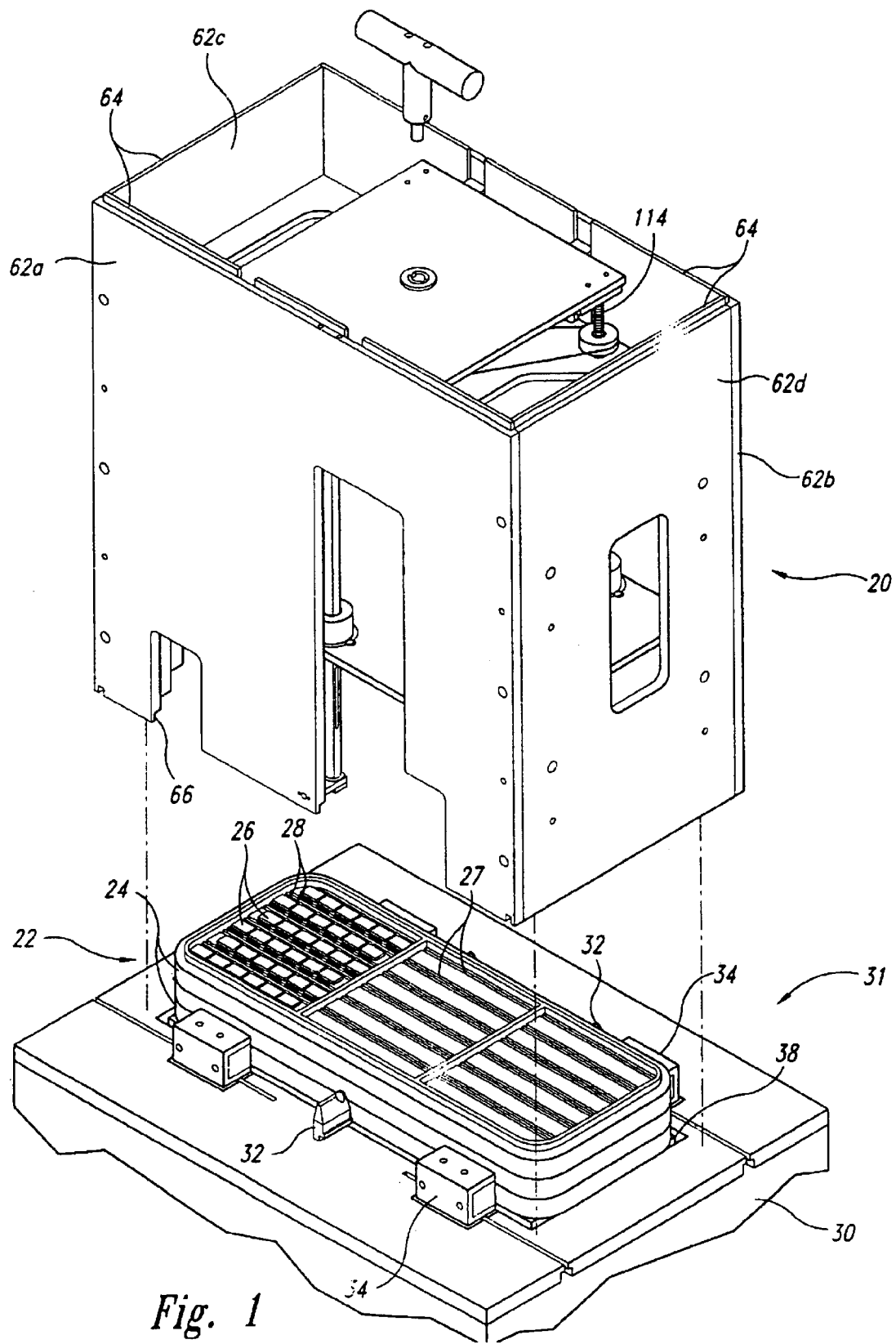
FIG. 1 is an isometric view of a device for retaining a stack of trays in accordance with one embodiment of the invention and a portion of a processing machine to which the device can be releasably attached.
Figure 2:
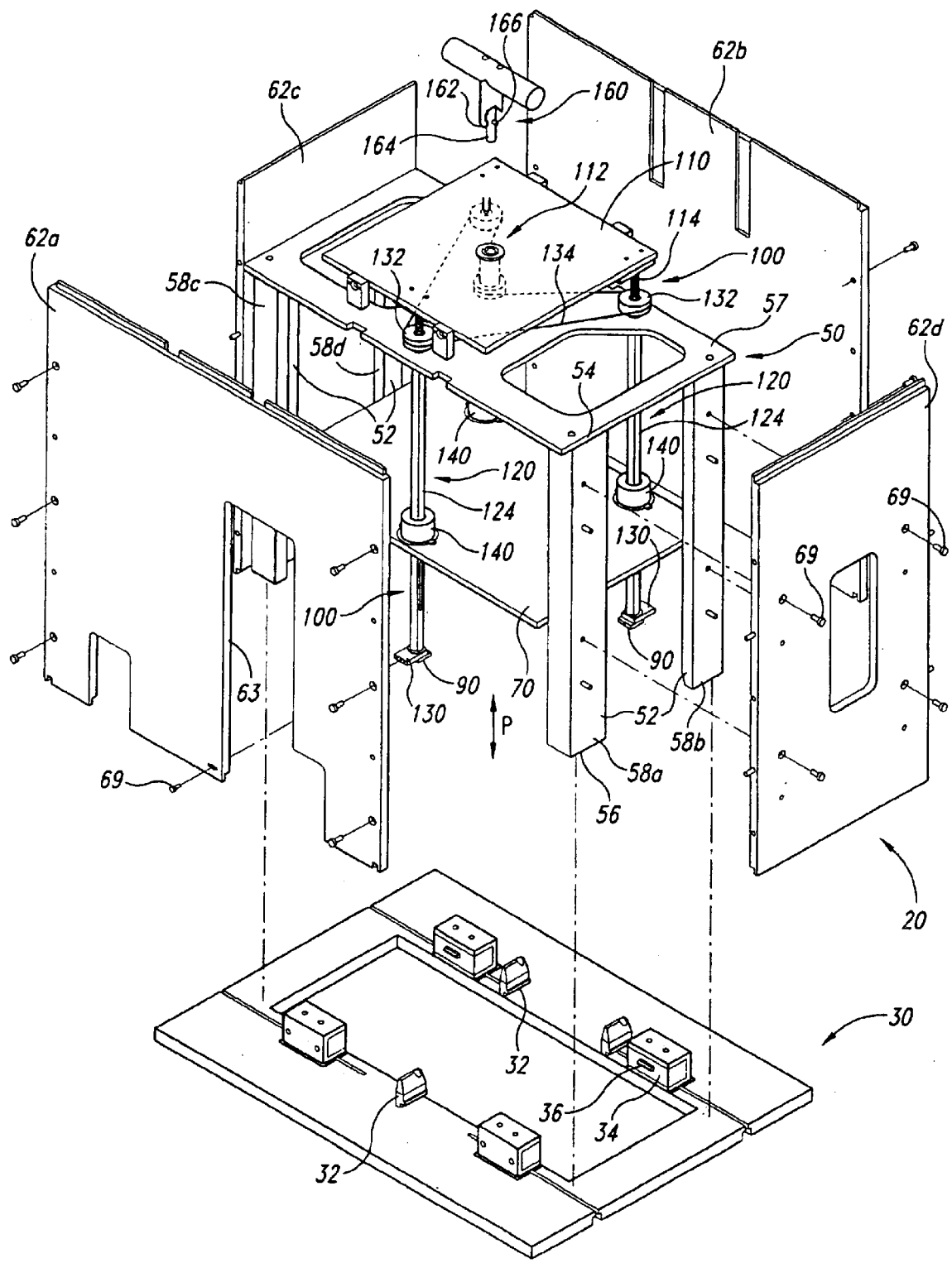
FIG. 2 is an exploded isometric view of the device of FIG. 1.

FIG. 1 is an isometric view and FIG. 2 is an exploded isometric view of a tray retainer 20 in accordance with one embodiment of the invention. The tray retainer 20 can retain a tray stack 22 having a plurality of individual trays 24 that carry packaged or unpacked IC devices 26. The individual trays 24 can be JEDEC trays that have a plurality of slots 27 or pockets to receive the IC devices 26. For example, in cases in which the IC device 26 has a plurality of pins 28, the slots or pockets 27 can receive the pins 28.

The tray retainer 20 can also be attached to a processing or testing machine 30 at a processing station 31. The processing machine 30 can include a plurality of fixed mounting elements 32 to engage and hold the tray retainer 20 to the processing station 31. The processing machine 30 can also include a plurality of tray singulators 34 having moveable tabs 36. The tray singulators 34 extend the moveable tabs 36 to hold a bottom tray of the tray stack 22 over a tray elevator 38 of the processing station 31. The tray singulators 34 can also retract the moveable tabs 36 to drop the bottom tray of the tray stack 22 onto the elevator 38. The tray singulators 34 then extend the moveable tabs 36 to engage and hold the next tray in the tray stack 22 so that only the bottom tray on the tray elevator 38 is separated from the other trays of the tray stack 22. The tray elevator 38 can then move downward to carry the IC devices 26 on the separated tray into the processing machine 30. As explained in greater detail below, the tray retainer 20 securely retains the plurality of trays 24 in the tray stack 22 for storing, transporting or processing the IC devices 26.

FIG. 2 illustrates several components of the tray retainer 20 in greater detail. The tray retainer 20 can include a casing or guide structure 50 configured to (a) allow the tray stack 22 (FIG. 1) to move through the guide structure 50 along a load/unload path P and (b) restrict the tray stack 22 from moving laterally with respect to the load/unload path P. This embodiment of the tray retainer 20 further includes a cross-member 70 extending across at least a portion of the guide structure 50 transverse to the load/unload path P, a plurality of moveable retaining elements 90, and a lock/release mechanism 100. The retaining elements 90 and the cross-member 70 can be coupled to the lock-release mechanism 100 and/or the guide structure 50. In this embodiment, the lock/release mechanism 100 moves the retaining elements 90 between a storage position and a load/unload position. As explained in more detail below, the lock/release mechanism 100 can also simultaneously hold the cross-member 70 when the retaining elements 90 are in the storage position, or release the cross-member 70 when the retaining elements 90 are in the load/unload position. The tray retainer 20 can securely hold the tray stack 22 in the storage position, but allows the tray stack 22 to move along the path P in the load/unload position. The particular features of several components of this embodiment of the tray retainer 20 will now be described in further detail.

The guide structure 50 can have a retaining assembly 52 including a first end 54 (or first region) and a second end 56

(or second region). In this embodiment, the retaining assembly 52 includes a bearing plate 57 and a plurality of L-shaped channel members 58 (identified by reference numbers 58a–58d). The retaining assembly 52 can have fewer than the four L-shaped channel members 58, or the channel members can have different shapes. The channel members 58 are configured to extend in the direction of the load/unload path P and they define a holding cavity with a shape corresponding to the profile of the tray stack 22 (FIG. 1). In one alternate embodiment (not shown in FIGS. 1 and 2), the retaining assembly 52 has a first C-shaped channel member attached to one end of the bearing plate 57 and a second C-shaped channel member attached to the opposite end of the bearing plate 57. In another alternate embodiment, the retaining assembly 52 can have two diagonally opposing L-shaped channel members (e.g., channel members 58a and 58d, or channel members 58b and 58c). The retaining assembly 52 can also be a single four sided box having a rectilinear cross section to receive rectilinear trays, or a cross-section of a different shape corresponding to the shape of different trays. The retaining assembly 52 is accordingly configured to restrict the tray stack from moving laterally with respect to the load/unload path P, and to guide the tray stack to move in the direction of the load/unload path P at appropriate stages of operating the tray retainer 20.

The guide structure 50 can be covered by a plurality of panels 62 (identified by reference numbers 62a–62d). In this particular embodiment, first and second side panels 62a and 62b are attached to sides of the retaining assembly 52, and first and second end panels 62c and 62d are attached to opposing ends of the retaining assembly 52. The panels 62 can be attached to the retaining assembly 52 and to each other by a plurality of bolts 69 or other suitable fasteners. The retaining assembly 52 and the panels 62 define a housing for containing the tray stack. The panels 62 can be a single formed sheet housing, casting or molding. Additionally, the guide structure 50 and the panels 62 can be formed from a single casting or molding.

Figure 3:
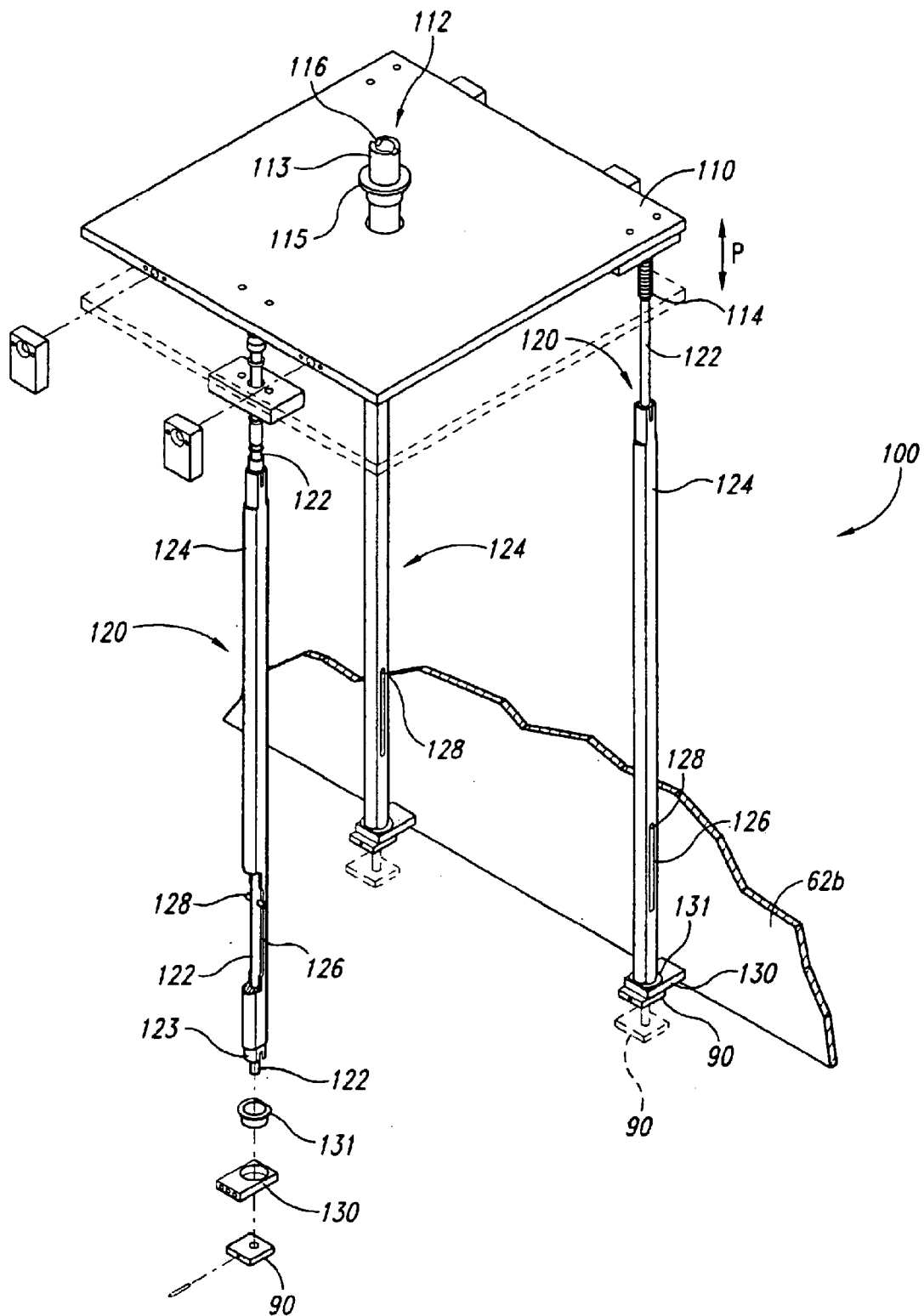
FIG. 3 is an exploded isometric view of a lock/release mechanism in accordance with an embodiment of the invention.

The lock/release mechanism 100 can be coupled to the guide structure 50 and the cross-member 70 within the housing. FIG. 3 is an exploded isometric view showing selected components of the lock/release mechanism 100. Referring to FIGS. 2 and 3 together, the lock/release mechanism 100 of this embodiment includes a spring plate 110, an actuator assembly 112, a plurality of elongated shafts 120, and a plurality of lock bearings 140 (FIG. 2). Each shaft 120 has a through-pin 122 attached to the spring plate 110, a sleeve 124 slidably receiving the through-pin 122, and a key 128 attached to the through-pin 122. The key 128 is also received in a slot 126 through the sleeve 124. The sleeves 124 have a lower hub 123 received in a bushing 131, and the bushing 131 is received in a fixed block 130. The block 130 is attached to one of the first or second side panels 62a (not shown in FIG. 3) or 62b. The blocks 130 accordingly hold the lower section of the sleeves 124 from moving vertically. The through-pins 122 can move axially through the sleeves 124 when the spring plate 110 moves vertically to move the retaining elements 90 in the direction of the load/unload path P under the blocks 130 (as shown in broken lines). The actuator assembly 112 is rotated in one direction to rotate the through-pins 122, the sleeves 124 and the retaining elements 90 into the storage position (shown in solid lines in FIG. 3) in which the retaining elements 90 project inwardly from the blocks 130 to obstruct the downward motion of the trays. The actuator assembly 112 can then be rotated 90° in the other direction to rotate the retaining elements 90 into the load/unload position (shown in broken lines in FIG. 3) in which the retaining elements 90 do not project inwardly past the blocks 130 to allow downward movement of the trays.

The actuator assembly 112 can include a drive cylinder 113 (FIG. 3), a plurality of pulleys 132 (FIG. 2) coupled to the through-pins 122, and a belt 134 (FIG. 2) contacting the pulleys 132 and the drive cylinder 113. To operate the actuator assembly 112, a handle 160 (FIG. 2) is inserted into the drive cylinder 113 and pressed against the spring plate 110 to drive the spring plate 110, the through-pins 122 and the retaining elements 90 downwardly in the direction of the load/unload path P. The handle 160 is then rotated 90° to rotate the shafts 120 and the retaining elements 90 between the storage position and the load/unload position.

In one particular embodiment, the handle 160 can have a tube 162, a guide-pin 164 projecting from the bottom of the tube 162, and a cross-pin 166 extending across the tube 162 at an intermediate location. The guide-pin 164 can be inserted into the drive cylinder 113 (FIG. 3) until the lower rim of the tube 162 presses against a bushing 115 (FIG. 3) on the spring plate 110 and the cross-pin 166 (FIG. 2) rests in a trough 116 (FIG. 3) of the drive cylinder 113. The handle 160 accordingly presses the spring plate 110 downwardly against a plurality of springs 114 by a distance equal to the distance between the lower rim of the tube 162 and the cross-pin 166. The rotational movement of the handle 160 rotates the drive cylinder 113 because the cross-pin 166 rests in the trough 116 when the handle 160 is fully inserted into the actuator 112. The rotation of the handle 160 moves the belt 134 to rotate the pulleys 132, the through-pins 122, the sleeves 124 and the retaining elements 90 between the storage position and the load/unload position.

The lock bearings 140 of the lock/release mechanism 100 are attached to the cross-member 70. Each lock bearing 140 has a hole to slidably receive a shaft 120. The rotation of the sleeves 124 relative to the lock bearings 140 also locks and releases the cross-member 70 in coordination with the position of the retaining elements 90. In this particular embodiment of the tray retainer 20, the interface between the lock bearings 140 and the sleeves 124 locks the cross-member 70 from moving along the load/unload path P when the retaining elements 90 are in the storage position. Conversely, when the retaining elements 90 are in the load/unload position, the interface between the lock bearings 140 and the sleeves 124 allows the cross-member 70 to move along the shafts 120 in the direction of the load/unload path P. As such, the cross-member 70 can be a floating plate that moves upwardly along the load/unload path P as trays are inserted into the tray retainer 20 or downwardly to drive the trays out of the tray retainer 20 when the retaining elements 90 are in the load/unload position.

The cross-member 70 and the retaining elements 90 also sandwich the trays 24 (FIG. 1) together in the storage position because the cross-member 70 engages a first end tray at one end of the tray stack and the retaining elements 90 engage a second end tray at the opposite end of the tray stack. Moreover, because both the cross-member 70 and the retaining elements 90 are locked against moving along the load/unload path when the retaining elements 90 are in the storage position, the cross-member 70 and the retaining elements 90 prevent the sandwiched tray stack from moving along the load/unload path. The tray retainer 20, therefore, can securely hold tray stacks having different numbers of trays for storage and transportation, and then quickly release the tray stack for easy loading/unloading at a processing machine.

The operation of the tray retainer 20 and the processing machine 30 are best understood by referring to FIGS. 1 and 2. The tray stack 22 is initially loaded into the tray retainer 20 by engaging the handle 160 with the actuator assembly 112 and rotating the handle 160 to move the retaining elements 90 into the load/unload position. The tray stack 22 is then inserted into the guide structure 50. The cross-member 70 slides along the shafts 120 as the tray stack 22 moves into the guide structure 50. After the trays are loaded into the guide structure 50, the handle 160 is rotated to move the retaining elements 90 into the storage position and to lock the cross-member 70 from moving axially along the shafts 120. The loaded tray retainer 20 is then stored or transported to a processing machine.

To remove individual trays 24 from the tray container 20 at the processing machine 30, the tray container 20 is placed onto the processing station 31. The handle 160 is reinserted into the actuator assembly 112 and rotated to move the retaining elements 90 from the storage position into the load/unload position. In this embodiment, when the guide elements 90 are in load/unload position, they also engage the mounting elements 32 at the processing station 31 to releasably hold the tray retainer 20 to the processing machine 30. The tray singulators 34 then separate the lower most tray 24 of the tray stack 22 and place it on the tray elevator 38. The trays 24 are accordingly unloaded from the tray retainer 20 to process the IC devices 26 in the processing machine 30. The processing machine 30 can also have a second processing station (not shown) with an empty tray retainer 20 to receive trays that have been reloaded with the processed package devices 26. Therefore, the processing machine 30 can have an input processing station with one tray retainer 20 and an output processing station with another tray retainer 20. After the trays 24 have been loaded into a tray retainer 20 at the output station, the handle 160 is rotated to move the retaining elements 90 into the storage position and to disengage the retaining elements 90 from the mounting elements 32. The loaded tray retainer 20 is then removed from the processing machine 30.

The embodiments of the tray retainer 20 shown in FIGS. 1–3 selectively hold the trays within the guide assembly 50 to prevent both axial and transverse movement with respect to the direction of the load/unload path P. As such, JEDEC trays 24 in a tray stack 22 cannot fall out of the tray retainer 20 or be separated from one another. The tray retainer 20 can even be dropped or jostled without damaging the JEDEC trays 24 or the IC devices 26. Therefore, the particular embodiments of the tray retainer 20 shown in FIGS. 1–3 are expected to reduce losses of IC devices caused by accidents.

The particular embodiments of the tray retainer 20 shown in FIGS. 1–3 can also be stacked upon one another to securely and efficiently store a large number of IC devices. Referring to FIG. 1, the panels 62 can each have a rim 64 projecting upwardly from their upper edges and a slot 66 extending along their lower edges. The rim 64 receives the slot 66 of an immediately adjacent upper tray retainer 20. The bottom of one tray retainer 20 can thus be stacked on top of a lower tray retainer 20. In another embodiment, the rim 64 can extend around a portion of the side of panel 62a and project away from the flat face of panel 62a, and the slot 66 can extend around a portion of panel 62b. One tray retainer 20 can thus be stacked on top of a side panel 62a of a lower tray retainer. The tray retainers 20 can thus be stacked vertically in top/bottom or side/side arrangements. The particular embodiments of the tray retainer 20 illustrated in FIGS. 1–3 can accordingly be stacked on top of and/or beside one another to efficiently store a large number of loaded or empty tray retainers 20.

The particular embodiments of the tray retainer 20 illustrated in FIGS. 1 and 2 can also allow movement along the load/unload path P only when the tray retainer 20 is mounted to the processing station 31 of the processing machine 30. One feature of these particular embodiments is that the retaining elements 90 engage the fixed mounting elements 32 at the processing station 31 and do not obstruct the tray stack 22 from moving along the load/unload path P when the retaining elements 90 are in the load/unload position. The tray retainer 20 is accordingly securely mounted to the processing station 31 at all times during which the retaining elements 90 are in the load/unload position. Therefore, the particular embodiments of the tray retainer 20 illustrated in FIGS. 1 and 2 are expected to inhibit the inadvertent removal of trays from the tray retainer 20.

Figure 4:
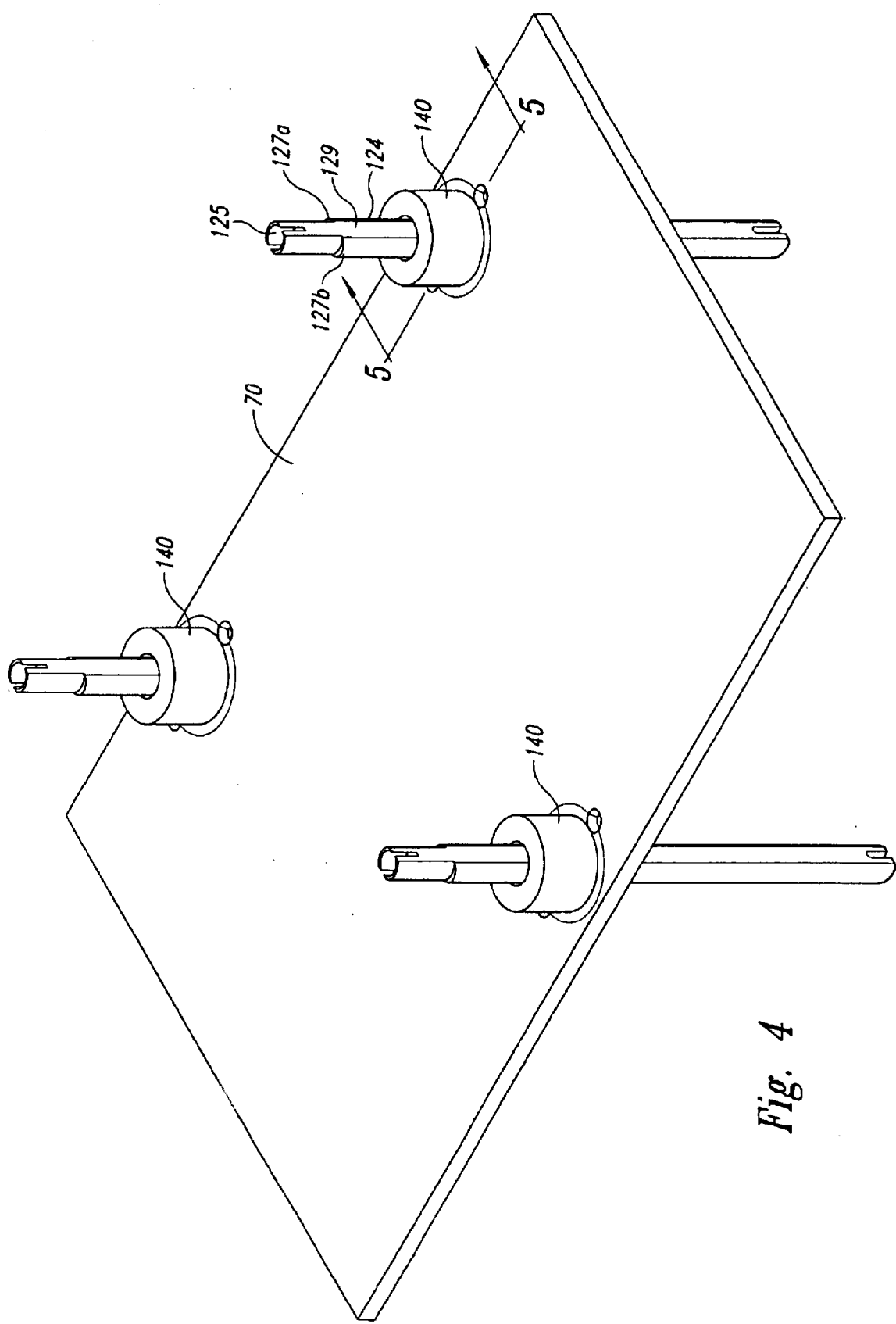
FIG. 4 is an isometric view partially illustrating a portion of the lock-release mechanism of FIG. 3.
Figure 5:
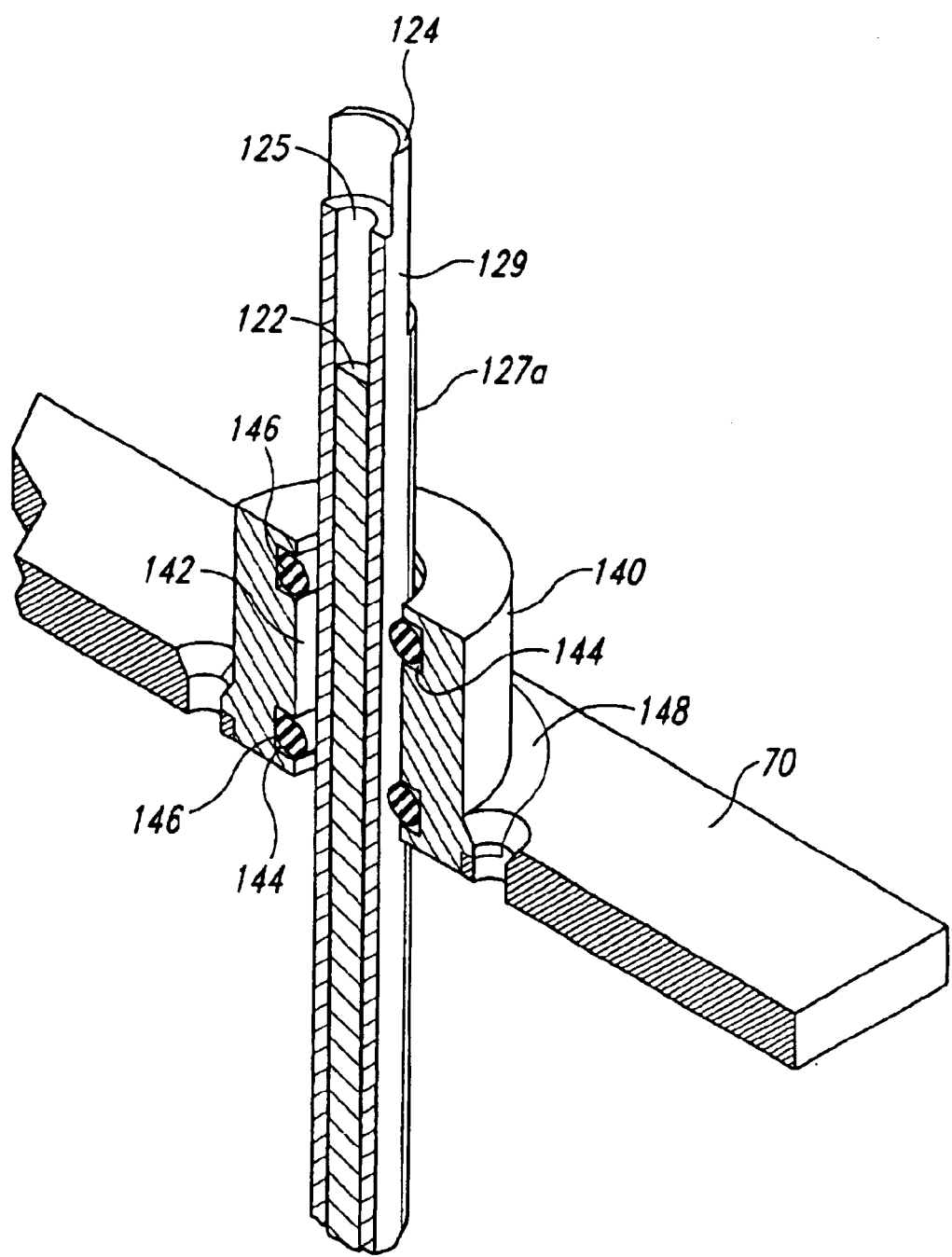
FIG. 5 is a partial cross-sectional view of the lock/release mechanism of FIG. 4 taken along line 5—5 of FIG. 4.

In light of the foregoing embodiments of tray retainers, particular embodiments of the lock bearing 140 and the sleeve 124 will now be described. FIG. 4 is an isometric view and FIG. 5 is a cross-sectional isometric view of one embodiment of the lock bearing 140 and the sleeve 124. The sleeve 124 can have an axial bore 125, outer sections 127 (identified by reference numbers 127a and 127b), and flat sections 129. Referring to FIG. 5, the sleeve 124 is received in an axial hole 142 of the lock bearing 140, and the through-pin 122 is received in the bore 125 of the sleeve 124. The lock bearing 140 also includes grooves 144, resilient engagement elements 146 received in the grooves 144, and an annular shoulder 148. Each lock bearing 140 can be attached to a plate or other structure (e.g., the cross-member 70) by a plurality of screws (not shown) that engage the annular shoulder 148. In operation, the sleeve 124 rotates with respect to the lock bearing 140 so that the outer sections 127 contact opposing sides of the engagement elements 146 for holding the cross-member 70, or so that the flat sections 129 face the engagement elements 146 to space the sleeve 124 apart from the engagement elements 146 for sliding the lock bearings 140 along the sleeve 124. The lock bearing 140 can be formed integrally with the cross-member 70.

Figure 6:
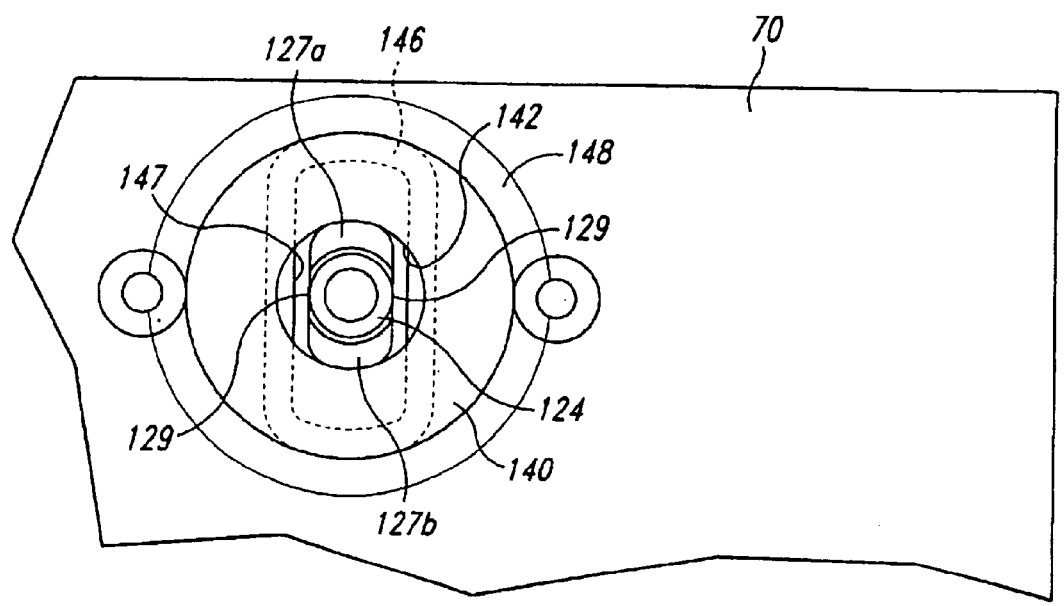
FIG. 6 is a top plan view of a portion of the lock/release mechanism in a released position.
Figure 7:
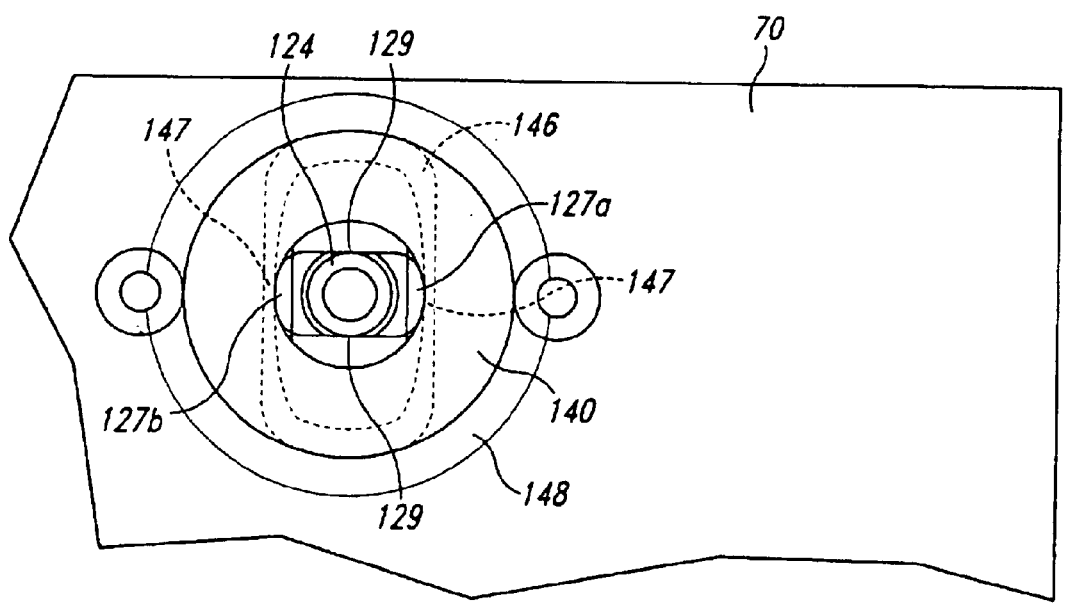
FIG. 7 is a top plan view of the portion of the lock/release mechanism shown in FIG. 6 in a locked position.

FIGS. 6 and 7 are top plan views of the operation of this embodiment of the sleeves 124 and the lock bearings 140. FIG. 6, more specifically, illustrates the sleeves 124 in the released position such that the flat sections 129 are spaced apart from contact sections 147 of the engagement elements 146. The outer sections 127 of the sleeve 124 can contact the wall of the hole 142 such that the lock bearing 140 slides along the curved surfaces of the outer sections 127. FIG. 7 illustrates the sleeves 124 in the locked position after they have been rotated 90° so that the outer sections 127 contact the contact surfaces 147 of the engagement elements 146. The frictional contact between the outer sections 127 and the flexible engagement elements 146 accordingly prevents the cross-member 70 from moving axially along the sleeves 124.

Figure 8B:
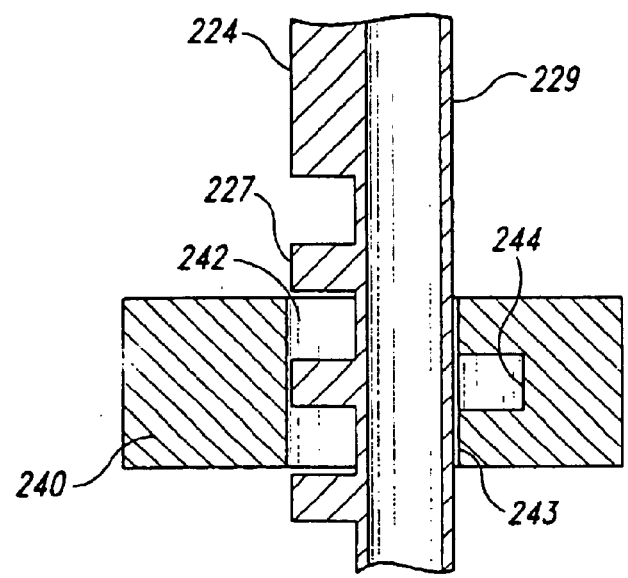
FIGS. 8B and 8C are partial cross-sectional views of the lock/release mechanism of FIG. 8A.
Figure 8C:
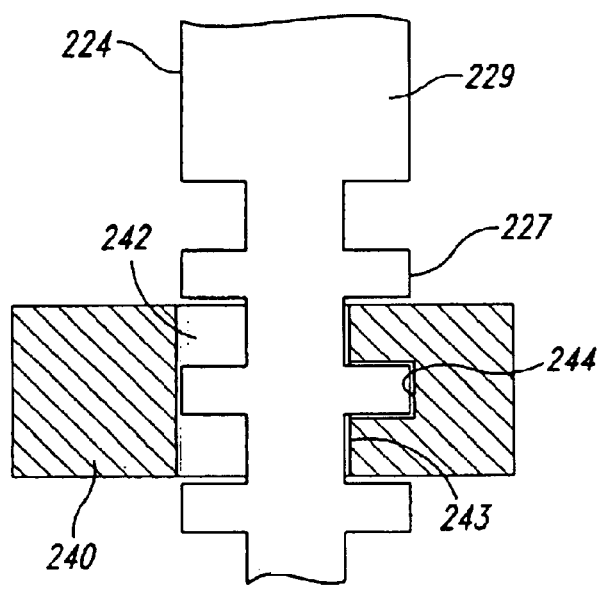

The lock bearing 140 and the sleeve 124 can have different configurations or be used on different machines. The lock bearing 140 and sleeve 124, for example, can be used in virtually any application in which a plate or other member moves along a rod, shaft or rail. Also, the lock bearing 140 and sleeve 124 can have other configurations in which the lock bearing 140 rotates relative to the sleeve 124, or in which rotation of more or less than 90° is sufficient to lock or release these components FIGS. 8A–8C illustrate another embodiment of a sleeve 224 and a lock bearing 240. In this embodiment, the sleeve 224 has an axial bore 225, a flat section 229, and a plurality of truncated annular teeth 227 spaced apart from one another along the length of the sleeve 224. The lock bearing 240 has an axial hole 242 through which the sleeve 224 is received, a flat portion 243, and a slot 244 in the flat portion 243. As shown by FIG. 8B, the flat section 229 of the shaft 224 faces the flat portion 243 of the lock bearing 240 in an unlocked position to allow the lock bearing 240 to slide along the shaft 224. FIG. 8C illustrates the shaft 224 and the lock bearing 240 after the shaft 224 has been rotated by 90°. As shown in FIG. 8C, at least one of the truncated annular teeth 227 is received in the slot 244 to prevent the lock bearing 240 from moving axially along the shaft 224.

Figure 9:
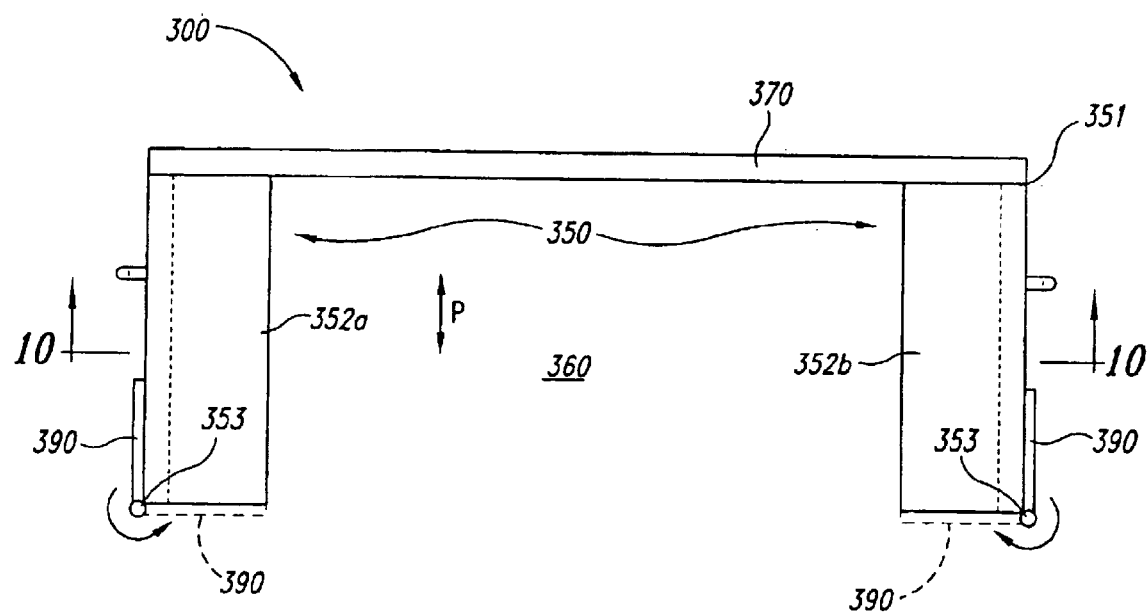
FIG. 9 is a side elevation view of an embodiment of a device for retaining a stack of trays in accordance with another embodiment of the invention.
Figure 10:
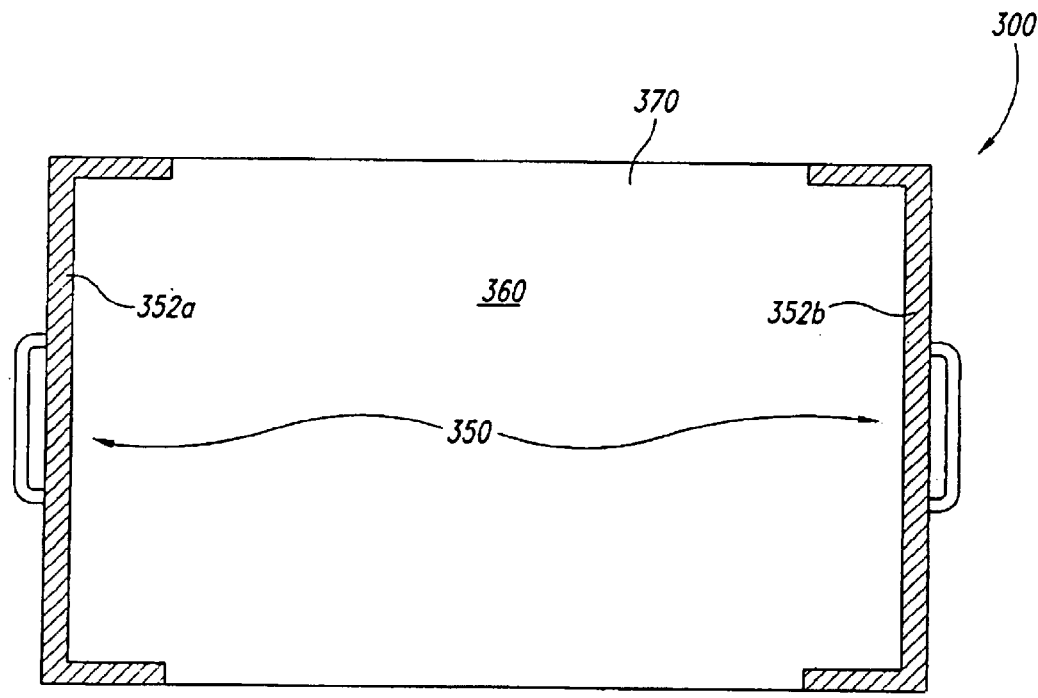
FIG. 10 is a cross-sectional view of the device of FIG. 9 taken along line 10—10.

The tray retainer can also have embodiments that are different from the embodiments of the tray retainer 20 described above with reference to FIGS. 1–3. For example, FIG. 9 is a side elevation view and FIG. 10 is a cross-sectional view along line 10—10 of FIG. 9 illustrating a tray retainer 300 in accordance with another embodiment of the invention. The tray retainer 300 can include a guide structure or casing 350 having a tray retaining assembly with a first channel section 352a and a second channel section 352b facing the first channel 352a. The first and second channel sections 352a and 352b can extend in the direction of the load/unload path P. The tray retainer 300 further includes a cross-member 370 extending transverse to the load/unload path P. The cross-member 370 generally extends at least partially across a first region 351 of the guide structure 350 between the first and second channel sections 352a and 352b. The cross-member 370 accordingly prevents trays from moving axially along the load/unload path P beyond the first region 351 of the guide structure 350.

The tray retainer 300 can also include a moveable retaining element 390 positioned at a second region 353 of the guide structure 350. The second region 353 of the guide structure 350 is spaced apart from the first region 351 such that the retaining elements 390 are spaced apart from the cross-member 370 by a distance equal to a desired height of a tray stack. In this particular embodiment, the moveable retaining element 390 is pivotally attached to each of the first and second channel sections 352a and 352b. The first and second regions 351 and 353 of the guide structure 350 can accordingly be at locations other than the ends of the guide structure 350.

The moveable retaining elements 390 are moveable from a load/unload position (shown in solid lines) to a storage position (shown in broken lines). In the load/unload position, the retaining elements 390 either do not project into a cavity 360 of the guide structure 350, or the retaining elements 390 merely do not project as far into the cavity 360 as they do in the storage position. In either case, a tray stack can be moved axially in the direction of the load/unload path P to slide trays into or out of the tray retainer 300 when the retaining elements 390 are in the load/unload position. In the storage position, the retaining elements 390 project transverse to the load/unload path P and into the cavity to hold the tray stack between the retaining elements 390 and the cross-member 370.

Figure 11:
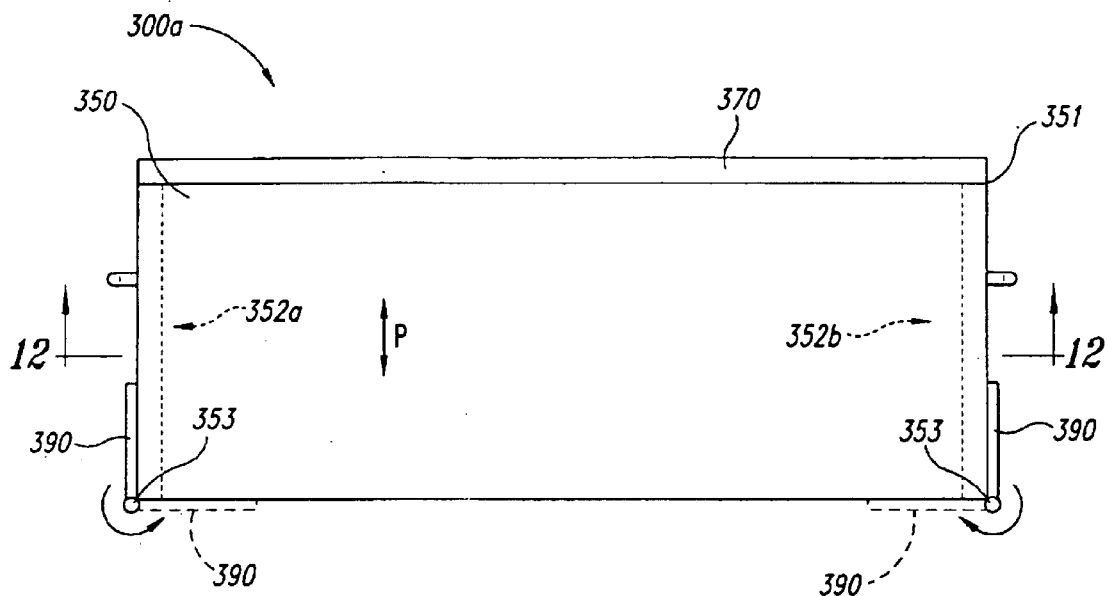
FIG. 11 is a side elevation view of still another embodiment of a device for retaining a stack of trays in accordance with still another embodiment of the invention.
Figure 12:
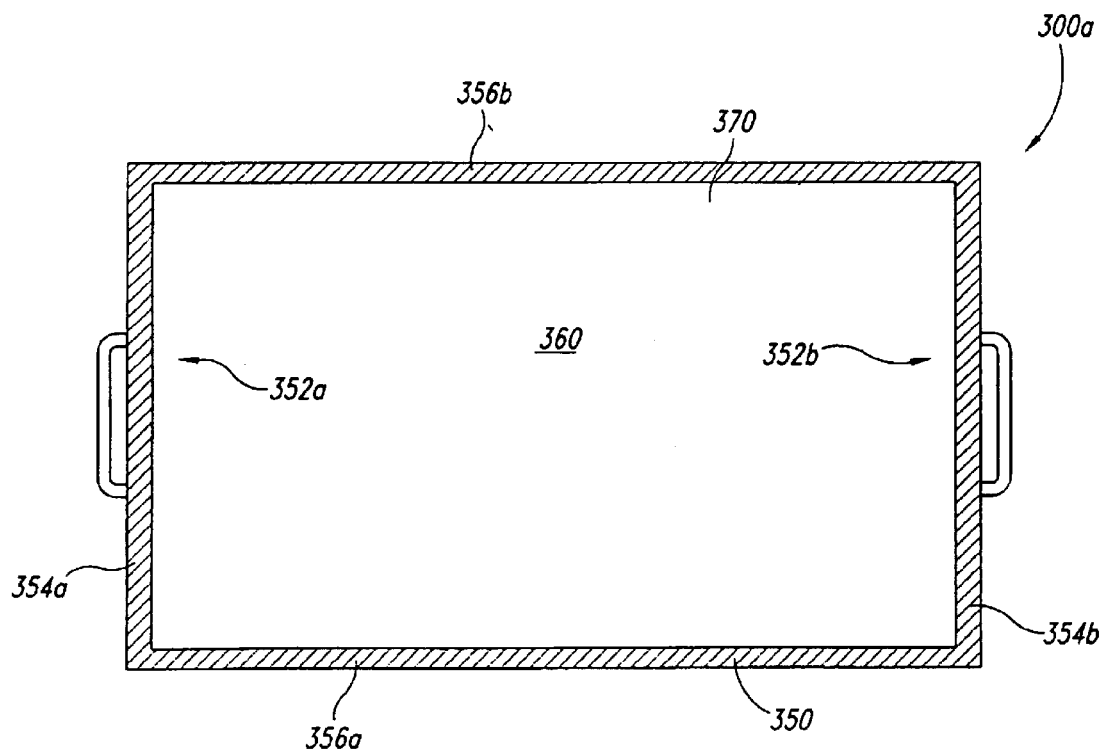
FIG. 12 is a cross-sectional view of the device of FIG. 11 taken along line 12—12.

FIGS. 11 and 12 illustrate a tray retainer 300a in accordance with another embodiment of the invention. In this embodiment, the tray retainer 300a has a unitary guide structure 350. The first channel section 352a is defined by one portion of the guide structure, and the second channel section 352b is defined by an opposing side of the guide structure. The guide structure 350 can be a four-sided box having end walls 354a and 354b, and side walls 356a and 356b. The retaining members 390 can be attached to the guide structure 350 at each end wall 354a and 354b, or at each side wall 356a or 356b.

Although the foregoing sets forth specific embodiments of the invention, it will be appreciated that various modifications may be made to the specific embodiments described above without deviating from the spirit and scope of the invention. The specific embodiments described above provide sufficient information to enable a person skilled in the art to make and use the best modes of the invention, but the claims are not limited to the particular embodiments described above. Accordingly, the invention is not limited except as by the appended claims.

What is claimed is:

1. A tray retainer for holding a tray stack having a plurality of trays that are configured to carry microelectronic devices, comprising:

a guide structure having a first region, a second region spaced apart from the first region, a first channel section extending in a direction of a load/unload path between the first and second regions, and a second channel section extending in the direction of the load/unload path between the first and second regions, the second channel section facing the first channel section;

a cross-member extending transverse to the load/unload path and at least partially across the first region of the guide structure between the first and second channel sections; and a moveable retaining element positioned at the second region of the guide structure, the retaining element being moveable to a storage position in which the retaining element projects a first distance transverse to the load/unload path into the second region of the guide structure, and the retaining element being moveable to a load/unload position in which the retaining element either does not project into the second region of the guide structure or projects a second distance less than the first distance, wherein when the tray retainer holds the tray stack and the retaining element is in the storage position, the cross-member contacts a tray at one end of the tray stack and the retaining element contacts a tray at the opposite end of the tray stack.

2. The tray retainer of claim 1 wherein:

the guide structure comprises a frame having a bearing plate with a first end and a second end, a plurality of elongated L-shaped channel members attached to the first and second ends of the bearing plate, and panels attached to at least one of the channel members and the bearing plate, the channel members including first and second channel members attached to the first end of the bearing plate defining the first channel section and third and fourth channel members attached to the second end of the bearing plate defining the second channel section, wherein the channel members project from the bearing plate in the direction of the load/unload path, and wherein the first channel member faces the third channel member and the second channel member faces the fourth channel member;

the tray retainer further includes a lock/release mechanism coupled to the guide structure, the cross-member and the retaining element, the lock/release mechanism including at least one shaft coupled to the retaining element, an actuator coupled to the shaft, and a lock bearing coupled to the cross-member, the shaft having a sleeve with a contact portion, a bore and a slot, and the shaft also having a through-pin slidably received in the bore of the sleeve, and the shaft further having a key attached to the through-pin and received in the slot of the sleeve, the key rotating the sleeve with rotation of the through-pin, the actuator having a pulley attached to one end of the though pin, a drive cylinder and a belt engaging the drive cylinder and the pulley, and the lock bearing having a resilient engagement member to selectively engage the contact portion of the sleeve, wherein an operator rotates the drive shaft to rotate the through-pin, sleeve and retaining element between the storage position and the load/unload position; and the cross-member comprises a moveable plate.

3. The tray retainer of claim 1 wherein the guide structure comprises a frame having a bearing plate with a first end and a second end, a plurality of elongated L-shaped channel members attached to the first and second ends of the bearing plate, and panels attached to at least one of the channel members and the bearing plate, the channel members including first and second channel members attached to the first end of the bearing plate defining the first channel section and third and fourth channel members attached to the second end of the bearing plate defining the second channel section, wherein the channel members project from the bearing plate in the direction of the load/unload path, and wherein the first channel member faces the third channel member and the second channel member faces the fourth channel member.

4. The tray retainer of claim 1 wherein:
the first channel section comprises a first C-shaped channel member, and the second channel section comprises a second C-shaped channel member; and
the cross-member comprises a plate having a first end attached to the first C-shaped channel member and a second end attached to the second C-shaped channel member.

5. The tray retainer of claim 1 wherein:
the first channel section comprises a first C-shaped channel member, and the second channel section comprises a second C-shaped channel member;
the cross-member comprises a floating plate extending at least partially between the first C-shaped channel member and the second C-shaped channel member, the floating plate being moveable along the load/unload path; and
the retaining element comprises a tab projecting into a cavity between the first and second C-shaped channel members in the storage position.

6. The tray retainer of claim 1 wherein:
the first channel section comprises first and second L-shaped channel members, and the second channel section comprises third and fourth L-shaped channel members; and
the cross-member comprises a plate having a first end attached to the first and second L-shaped channel members and a second end attached to the third and fourth L-shaped channel members.

7. The tray retainer of claim 1 wherein:
the first channel section comprises first and second L-shaped channel members, and the second channel section comprises third and fourth L-shaped channel members;
the cross-member comprises a floating plate extending at least partially between the first L-shaped channel member) the second L-shaped channel member, the third L-shaped channel member, and the fourth L-shaped channel member, the floating plate being moveable along the load/unload path; and
the retaining element comprises a tab projecting into a cavity between the first and second L-shaped channel members in the storage position.

8. The tray retainer of claim 1 wherein:
the guide structure comprises a unitary shell, and the first channel section is defined by a first end of the shell and the second channel section is defined by a second end of the shell; and
the cross-member comprises a plate attached to the shell.

9. The tray retainer of claim 1, further comprising a lock/release mechanism having an actuator, a shaft having a first end coupled to the retaining element and a second end coupled to the actuator, and a lock bearing attached to the cross-member and slidably receiving the shaft, the actuator rotating to rotate the retaining element between the storage position and the load/unload position and to rotate the shaft between a lock position and a release position relative to the lock bearing, the lock bearing preventing the cross-member from moving along the shaft when the shaft is in the lock position and the retaining element is in the storage position, and the lock bearing allowing the cross-member to move along the shaft when the shaft is in the release position and the retaining element is in the load/unload position.

10. The tray retainer of claim 1, further comprising a lock/release mechanism having an actuator and a shaft coupled to the actuator, the actuator having a drive cylinder and a belt contacting the drive cylinder, and the shaft having a through-pin including a first end coupled to the belt and a second end attached to the retaining element, a key attached to the through-pin proximate to the second end, and a sleeve having a bore receiving the through-pin and a slot receiving the key, wherein rotation of the drive cylinder rotates the through-pin and the sleeve to move the shaft between a lock position in which the retaining element is in the storage position and a release position in which the retaining element is in the load/unload position.

11. The tray retainer of claim 1 wherein:
the guide structure comprises a frame having a bearing plate and a plurality of channel members including at least a first channel member projecting from one end of the bearing plate and a second channel member projecting from another end of the bearing plate, the first channel member defining the first channel section of the guide structure and the second channel member defining the second channel section of the guide structure;
the retaining element comprises a tab; and
the tray retainer further comprising a lock/release mechanism having an actuator, a shaft coupled to the actuator, and a lock bearing slidably receiving the shaft and attached to the cross-member, wherein movement of the actuator to a first position moves shaft to a lock position in which the lock bearing engages the shaft to prevent the cross-member from moving along the shaft and in which the tab projects into a space between the first and second channel members in the storage position, and wherein movement of the actuator to a second position moves the shaft to a release position in which lock bearing disengages the shaft to allow the cross-member to move along the shaft and in which the tab is at least partially removed from the space between the first and second channel members in the load/unload position.

12. The tray retainer of claim 1, further comprising a lock/release assembly including:
a lock bearing attached to the cross-member, the lock bearing having a hole;
a shaft extending in the direction of the load/unload path, the shaft being slidably and rotatably received in the hole of the lock bearing, wherein at least one of the lock bearing and the shaft rotates between a lock position and a release position; and an engagement assembly having an engagement element, a contact surface and a release surface, the engagement element being coupled to one of the shaft or the lock bearing, and the contact surface and the release surface being on the other of the shaft or the lock bearing, the contact surface being configured to contact the engagement element and prevent axial movement between the lock bearing and the shaft in the lock position, and the release surface being configured to be spaced apart from the engagement element and allow axial movement between the lock bearing and the shaft in the release position.

13. The tray retainer of claim 12 wherein:

the shaft comprises a contoured elongated member having a flat section defining the release surface and a rounded outer section defining the contact surface, the rounded outer section having a curved outer surface with a diameter to fit within the hole of the lock bearing; and the lock bearing comprises a hub having a cylindrical hole, an interior groove with in the hole, and a resilient member defining the engagement member in the groove, the flat section being juxtaposed to the resilient member in the release position and the outer section contacting the resilient member in the lock position.

14. The tray retainer of claim 12 wherein:

the shaft comprises an elongated member having a flat section defining the release surface and a plurality of truncated annular teeth defining the contact surface; and the lock bearing comprises a hub having a cylindrical hole, a flat portion, and a slot in the flat portion defining the engagement element, the flat section of the shaft being juxtaposed to the flat portion of the lock bearing in the release position and at least one of the annular teeth being in the slot in the lock position.

15. A retainer for holding a tray stack having a plurality of trays configured to carry a plurality of microelectronic devices, comprising:

a casing having a guide structure with a first end, a second end, an interior holding area, and an opening at the second end of the guide structure for receiving the trays, the guide structure being configured to receive the tray stack and allow the tray stack to move along a load/unload path through the guide structure;

a cross-member member extending across at least a portion of the casing transverse to the load/unload path, the cross-member being spaced apart from the second end of the casing; and a plurality of moveable retaining elements at least proximate to the second end, the retaining elements being moveable between a storage position in which the retaining elements project into the interior holding area of the guide structure to obstruct the load/unload path, and the retaining elements being moveable into a load/unload position in which the retaining elements are clear of the load/unload path, wherein when the retainer holds the tray stack and the retaining elements are in the storage position, the cross-member and the retaining elements hold the tray stack and inhibit movement of the tray stack along the load/unload path.

16. The retainer of claim 15 wherein:

the guide structure has a first channel section comprising a first C-shaped channel member and a second channel section comprising second C-shaped channel member; and the cross-member comprises a plate having a first end attached to the first C-shaped channel member and a second end attached to the second C-shaped channel member.

17. The retainer of claim 15 wherein:

the guide structure has a first channel section comprising a first C-shaped channel member and a second channel section comprising a second C-shaped channel member;

the cross-member comprises a floating plate extending at least partially between the first C-shaped channel member and the second C-shaped channel member, the floating plate being moveable along the load/unload path; and the retaining element comprises a tab projecting into a cavity between the first and second C-shaped channel members in the storage position.

18. The retainer of claim 15 wherein:

the guide structure has a first channel section comprising first and second L-shaped channel members and a second channel section comprising third and fourth L-shaped channel members; and the cross-member comprises a plate having a first end attached to the first and second L-shaped channel members and a second end attached to the third and fourth L-shaped channel members.

19. The retainer of claim 15 wherein:

the guide structure has a first channel section comprising first and second L-shaped channel members and a second channel section comprising third and fourth L-shaped channel members;

the cross-member comprises a floating plate extending at least partially between the first L-shaped channel member, the second L-shaped channel member, the third L-shaped channel member, and the fourth L-shaped channel member, the floating plate being moveable along the load/unload path; and the retaining element comprises a tab projecting into a cavity between the first and second L-shaped channel members in the storage position.

20. The retainer of claim 15, further comprising a lock/release assembly including:

a lock bearing attached to the cross-member, the lock bearing having a hole;

a shaft extending in the direction of the load/unload path, the shaft being slidably and rotatably received in the hole of the lock bearing, wherein at least one of the lock bearing and the shaft rotates between a lock position and a release position; and an engagement assembly having an engagement element, a contact surface and a release surface, the engagement element being coupled to one of the shaft or the lock bearing, and the contact surface and the release surface being on the other of the shaft or the lock bearing, the contact surface being configured to contact the engagement element and prevent axial movement between the lock bearing and the shaft in the lock position, and the release surface being configured to be spaced apart from the engagement element and allow axial movement between the lock bearing and the shaft in the release position.

21. A retainer for holding a tray stack having a plurality of trays that are configured to carry microelectronic devices, comprising:

a protective casing including a guide structure having a first guide section configured to receive a first side of the tray stack, a second guide section configured to receive a second side of the tray stack, the first and second guide sections defining an opening and an interior holding area configured to retain the tray stack in a stacked arrangement and to allow the tray stack to move through the guide structure;

a cross-member extending at least partially between the first and second guide sections; and a plurality of moveable retaining elements in the casing at least proximate to the opening, the retaining elements being moveable between a storage position in which the retaining elements project into the opening and a load/unload position in which the retaining elements either do not project as far into the opening or are completely removed from the opening, wherein when the retainer holds the tray stack and the retaining elements are in the storage position, the cross-member supports one end of the tray stack and the retaining elements support the opposite end of the tray stack.

22. The retainer of claim 21 wherein:

the first channel section comprises a first C-shaped channel member, and the second channel section comprises a second C-shaped channel member; and the cross-member comprises a plate having a first end attached to the first C-shaped channel member and a second end attached to the second C-shaped channel member.

23. The retainer of claim 21 wherein:

the first channel section comprises first and second L-shaped channel members, and the second channel section comprises third and fourth L-shaped channel members; and the cross-member comprises a plate having a first end attached to the first and second L-shaped channel members and a second end attached to the third and fourth L-shaped channel members.

24. The retainer of claim 21, further comprising a lock/release assembly including:

a lock bearing attached to the cross-member, the lock bearing having a hole;

a shaft extending in the direction of the load/unload path, the shaft being slidably and rotatably received in the hole of the lock bearing, wherein at least one of the lock bearing and the shaft rotates between a lock position and a release position; and an engagement assembly having an engagement element, a contact surface and a release surface, the engagement element being coupled to one of the shaft or the lock bearing, and the contact surface and the release surface being on the other of the shaft or the lock bearing, the contact surface being configured to contact the engagement element and prevent axial movement between the lock bearing and the shaft in the lock position, and the release surface being configured to be spaced apart from the engagement element and allow axial movement between the lock bearing and the shaft in the release position.

\* \* \* \* \*